United States Patent

Baldwin et al.

[11] Patent Number: 6,006,636
[45] Date of Patent: Dec. 28, 1999

[54] PROGRAMMABLE PUNCH MECHANISM

[75] Inventors: Michael R. Baldwin, Peekskill; Anthony F. Coneski, Newburgh; Alan V. Hall, Wappingers Falls, all of N.Y.

[73] Assignee: International Business Machines Corporation, Armonk, N.Y.

[21] Appl. No.: 08/900,090

[22] Filed: Jul. 24, 1997

[51] Int. Cl.[6] .................................................. B26F 1/04
[52] U.S. Cl. ................................... 83/13; 83/627; 83/687; 83/699.31
[58] Field of Search ........................... 83/571, 575, 620, 83/627, 687, 691, 699.31, 13

[56] References Cited

U.S. PATENT DOCUMENTS

| | | | |
|---|---|---|---|
| 2,110,998 | 3/1938 | McDaniels | 83/140 |
| 2,364,834 | 12/1944 | Whistler et al. | 83/699.31 |
| 3,786,731 | 1/1974 | Bobst et al. | 83/564 |
| 4,421,000 | 12/1983 | Murphy | 83/571 |
| 4,555,966 | 12/1985 | Klingel | 83/71 |
| 4,569,267 | 2/1986 | Klingel | 83/571 |
| 4,623,089 | 11/1986 | Scott | 83/571 |
| 4,650,114 | 3/1987 | Salvagnini | 83/571 |
| 4,685,613 | 8/1987 | Schambre | 83/571 |
| 4,929,276 | 5/1990 | Chun et al. | 83/552 |
| 5,044,238 | 9/1991 | Etcheparre et al. | 83/76.1 |
| 5,140,879 | 8/1992 | Haj-Ali-Ahmadi et al. | 83/571 |
| 5,400,682 | 3/1995 | Matsuura | 83/49 |

OTHER PUBLICATIONS

IBM Technical DIsclosure, "Stroke Minimization of a Programmable Punch Tool", vol. 29, No. 5, Oct. 1986, pp. 1961–1964.

*Primary Examiner*—Kenneth E. Peterson
*Assistant Examiner*—Gyounghyun Bae
*Attorney, Agent, or Firm*—DeLio & Peterson, LLC; Robert Curcio; Ira D. Blecker

[57] ABSTRACT

An apparatus for simultaneously punching multiple holes in a ceramic substrate comprises a plurality of vertically movable and individually solenoid-operable punch drives disposed on a frame and selectively movable up and down relative to the frame. A horizontal arm extends from each of the punch drives and a punch extends from each of the extending arms and is movable vertically by the extending arms. Each of the punches is operable individually and operable simultaneously with selected others of the punches to punch one or more holes in a substrate at the same time. There may be provided at least four of the punches wherein the punches are disposed horizontally adjacent to one another in at least a 2×1 or a 2×2 grid with a spacing between adjacent punches of less than 8 mm. There may also be provided a control system for selectively operating the punch drives, with the control system adaptable to minimize the number of simultaneous strokes of the punches needed to punch a required number of holes in a substrate.

23 Claims, 6 Drawing Sheets

PROGRAMMABLE PUNCH MECHANISM

BACKGROUND OF THE INVENTION

1. Field of the Invention

The present invention relates to an apparatus for simultaneously punching multiple holes in a ceramic substrate used to produce multi-layer ceramic (MLC) substrates for integrated circuit chips.

2. Description of Related Art

The trend in ceramic electronic packaging of multilayer ceramic substrates is toward "flip chip" technology, also known as controlled collapse chip contact/connection C-4, with extremely high chip/substrate interconnect point counts. As a result, packages need to have high via counts concentrated in the relatively small area where the chip attaches to the substrate.

When punching via holes in green ceramic sheets, there has typically been utilized a punch apparatus in which a magnetically operated solenoid moves a punch rod, the lower end of which is coaxially aligned with a punch. The solenoid causes the pushrod to move up and down in individual strokes to cause the punch to punch a via hole in the ceramic greensheet aligned with a die plate under the substrate. An annular magnet coaxially aligned with the punch maintains the punch in the up position between strokes. It has been known to utilize a plurality of such coaxially aligned solenoid/punch mechanism to punch via holes in MLC substrates. For example, a die set may contain a plurality of punches arranged in a manner that match, as closely as possible, the pattern of via holes required on the product. A technique to minimize punch stroke counts required of such a die setup is described in IBM Technical Disclosure Bulletin, Vol. 29, No. 5 (October, 1986). While this program with the aforementioned die set operated well in previous MLC via pattern requirements, a problem exists in optimizing die set design to match many new products which contain very dense C-4 cages. The current system has not been able to accommodate die mandates with a minimum punch-to-punch spacing of less than 8 mm. With the dense via requirements of current C-4 cages, for example, containing 800 vias with punch spacing less than 8 mm, there will be required 800 strokes to punch the C-4 cage, one punch at a time.

Bearing in mind the problem and deficiencies of the prior art, it is therefore an object of the present invention to provide a punch mechanism which may be used to simultaneously punch via holes in a ceramic substrate with punch-to-punch spacing of less than 8 mm.

It is another object of the present invention to provide a punch mechanism which permits punches to be placed very close together, with several punches within a chip attach area, and still allow each punch to be individually selectable for punching a via hole.

It is another object of the present invention to provide an improved punch mechanism with the above advantages and which permits the punches to be placed in a grid of at least two-by two punches with spacing comparable to that of the via holes for C-4 chip technology.

It is a further object of the present invention to provide a punch mechanism which may be programmable to individually and simultaneously operate one or more of a multiple punch die setup to increase throughput where via holes are very closely spaced.

It is yet another object of the present object to provide a multiple punch mechanism arranged in a grid which permits several punches to be extended at every punch stroke.

It is a further object of the present invention to provide a programmable punch mechanism in which the punches are selectively and simultaneously operable by solenoids.

SUMMARY OF THE INVENTION

The above and other objects, which will be apparent to those skilled in the art, are achieved by the present invention which provides an apparatus for simultaneously punching multiple holes in a ceramic substrate. The apparatus comprises a frame and a plurality of vertically movable and individually operable punch drives disposed on the frame selectively movable up and down relative to the a frame. A member extends from each of the punch drives and is movable vertically by operation of the punch drives. A punch extends from each of the extending members and is movable vertically by the extending members. Each of the punches is horizontally offset from and non-coaxially aligned with an associated vertical punch drive. Each of the punches is operable individually and operable simultaneously with selected others of the punches to punch one or more holes in a substrate at the same time.

Preferably, each of the punch drives comprises a magnetically operable solenoid. The punches are preferably disposed horizontally adjacent to one another and the vertical punch drives are disposed horizontally outward of the punches. There may be provided at least two or four of the punches wherein the punches are disposed horizontally adjacent to one another in at least a 2×1 grid or 2×2 grid, respectively, with a spacing between adjacent punches of less than 8 mm.

The member extending from each of the punch drives preferably comprises an arm extending horizontally from the punch drives, with the arm having at an end away from the punch drive a cavity for receiving the punch. There may also be provided a control system for selectively operating the punch drives, with the control system adaptable to minimize the number of simultaneous strokes of the punches needed to punch a required number of holes in a substrate.

In another aspect, the present invention provides an apparatus for punching holes in a ceramic substrate comprising a frame; a substrate holder mounted on the frame capable of horizontal movement to position a the substrate in a desired location; and a ceramic substrate disposed on the substrate holder, the substrate having a location where a hole is desired to be punched. A vertically movable pushrod is disposed on the frame and horizontally offset from the desired substrate hole location and a magnetically operable solenoid drive associated with the vertical drive guide for selectively moving the pushrod up and down in individual strokes. An arm extends horizontally from the pushrod and is movable vertically by operation of the drive; and a punch extends from the arm and is movable vertically by the arm a stroke distance equal to the stroke distance of the pushrod. The punch is horizontally offset from the vertical pushrod and vertically aligned with the desired substrate hole location, and is operable to punch a hole in a substrate at the desired substrate hole location.

In a further aspect, the present invention provides a method of simultaneously punching multiple holes in a ceramic substrate. First, there is provided a punch apparatus comprising a frame; a plurality of vertically movable and individually operable punch drives disposed on the frame selectively movable up and down relative to the frame; a member extending from each of the punch drives and movable vertically by operation of the punch drives; and a punch extending from each of the extending members and movable vertically by the extending members, each of the punches being horizontally offset from an associated vertical punch drive. The method then comprises the steps of positioning a substrate beneath the punches, and individually and simultaneously operating a selected number of the punches to punch one or more holes in a substrate at the same time, each hole being punched at a position non-coaxially aligned with the vertical punch drive associated with the punch making the hole.

Preferably, the holes are disposed horizontally adjacent to one another in at a grid pattern and the punch drives are disposed horizontally outward of the grid of the punches. The method controls the operation of the punch drives to minimize the number of simultaneous strokes of the punches needed to punch a required number of holes in a substrate

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–7 of the drawings in which like numerals refer to like features of the invention. Features of the invention are not necessarily shown to scale in the drawings.

The preferred programmable punch mechanism of the present invention is configured to be installable in and removable from a computer controlled punching tool containing all the necessary electronics to intelligently select and drive a plurality of die set solenoids while coordinating horizontal X and Y motions of a ceramic sheet to be used as the substrate. Such a programmable computer algorithm is described in the aforementioned IBM Technical Disclosure Bulletin, Vol. 29, No. 5 (October, 1986), the disclosure of which is hereby incorporated by reference.

Figure 1:
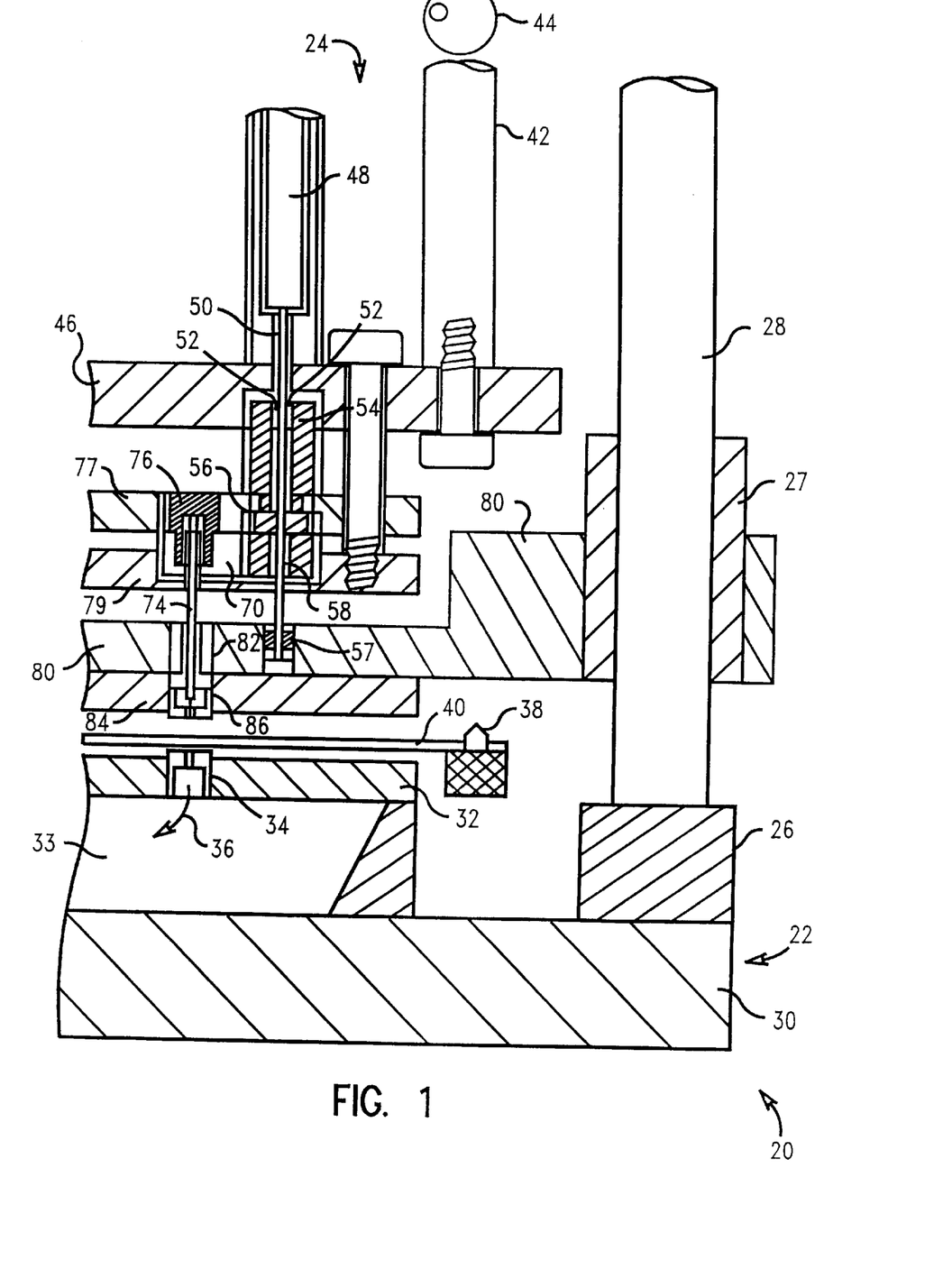
FIG. 1 is a side elevational view of a portion of a preferred embodiment of the programmable multiple punch apparatus of the present invention.

In FIG. 1 there is shown a preferred punch apparatus 20 having a lower frame assembly on which is disposed a workpiece holder and die set, and an upper frame assembly 24 which contains the punch mechanism.

Lower frame assembly 22 includes a base plate 30 on which is mounted a die plate 32 containing a die bushing 34. Die bushing 34 contains the female portion of the die mated to the punch to be used to punch the hole in the ceramic substrate. The plug, which consists of material removed from a substrate during the punching operation, is rejected from the bottom of the die bushing as shown by arrow 36. In order to mount the moveable upper frame assembly on the lower frame, there is provided a die post mount 26 on the lower plate 30, on which is mounted the die post shaft 28. The entire upper frame assembly 24 rides on guide plate 80 attached to guide plate bearings 27 which are vertical slideable on guide post 28. Rigidly attached to guide plate 80 and vertically moveable with the entire upper frame assembly are solenoid plate 46, magnet plate 77, retractor plate 79 and stripper plate 84. To provide vertical movement to the upper frame assembly to load and unload ceramic sheets from the workpiece holder, there is provided an eccentric actuator 44 which operates to move a drive rod 42 vertically (Z direction).

To load a workpiece such as an unfired ceramic sheet 40, the Z actuator 44 is operated to lift the upper frame assembly 24 away from the lower frame assembly 22 to separate stripper plate 84 and die plate 32. Substrate 40 may then be located on pins on XY indexer 38, which is capable of making horizontal movement of the ceramic sheet 40 in the X and Y directions so that a hole may be punched in the ceramic sheet at a desired location.

Figure 2:
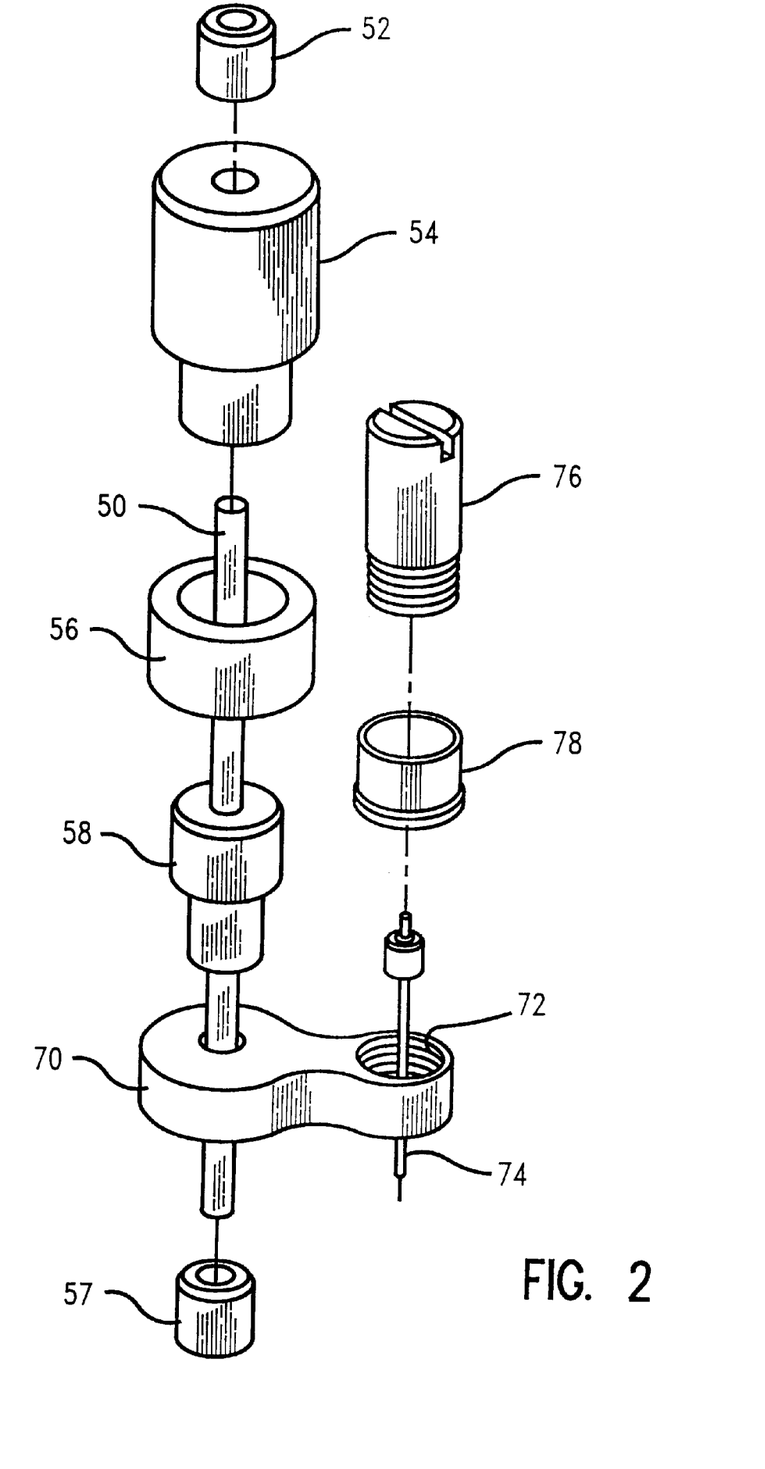
FIG. 2 is an exploded perspective view of a portion of the punch apparatus of FIG. 1 showing the individual punch mechanism.

The punch mechanism of the present invention is depicted in the upper frame assembly 24 in FIG. 1, and an exploded view of a portion thereof is shown in FIG. 2. A mechanically and magnetically operated solenoid 48 is mounted on solenoid plate 46 to effect up and down vertical movement on pushrod 50. Pushrod 50 extends through an opening in solenoid plate 46. The lower end of pushrod 50 is guided by guide bushing 57 which is mounted in an opening in guide plate 80. Rigidly attached to pushrod 50 is a horizontally extending actuator arm 70, which is held in place by a collar 58 on pushrod 50. Above collar 58 there is provided a guide sleeve 54. Magnet plate 77 and retractor plate 79 are sufficiently spaced so as to permit full stroke movement of actuator arm 70.

When solenoid 48 is energized, pushrod 50 is driven downward to an extended position. In order to hold the pushrod 50 and actuator arm 70 in an up (retracted) position when the solenoid is not energized, there is provided an annular or doughnut shaped magnet 56 which surrounds pushrod 50 between guide sleeve 54 and arm 70. Doughnut shaped magnet 56 operates on actuator arm 70 (which should be made of, at least in part, of a ferromagnetic material) to hold the entire punch assembly in an up position both during the time when the upper frame assembly is moved up (during loading and unloading of the substrate) and when the upper frame assembly 24 is in the down position and the solenoid is not energized.

At the end of actuator arm 70, horizontally extended away from the axis of pushrod 50, there is mounted the vertically oriented punch 74 within cavity 72 of arm 70. A punch holder 76 is threaded into corresponding threads in cavity 72, with an intermediate holder guide bushing to rigidly secure and lock the upper portion of punch 74 in position. Punch holder guide bushing 78 provides bearing surface for punch holder 76 and prevents the horizontally offset punch holder assembly from rotating about the axis formed by pushrod 50.

The lower portion of punch 74 passed through an opening in guide plate 80 in which is inserted an annular guide bushing 82 to assist in guiding punch 74. A stripper plate 84 contains an opening for a stripper bushing 86 through which the lower portion of punch 74 passes which contains the male portion of the die to punch the hole in the ceramic greensheet 40. Pushrods 50 comprise the vertically moveable drives for the punch, and, unlike the prior art, the punches 74 are not coaxially aligned with the pushrods.

Figure 3:
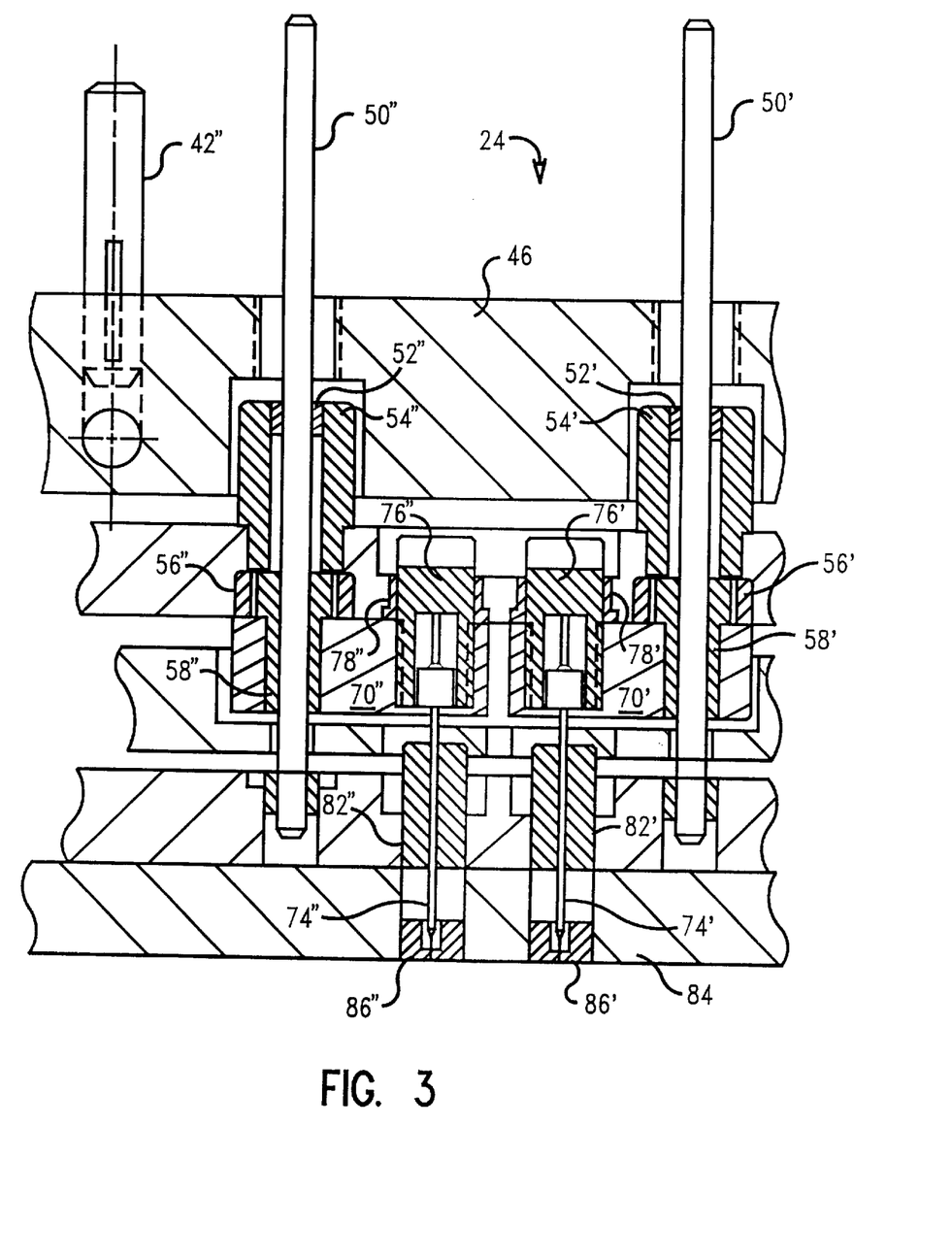
FIG. 3 is a side elevational view of a portion of the punch apparatus of FIG. 1 showing multiple punch mechanisms side-by-side in a grid pattern.
Figure 4:
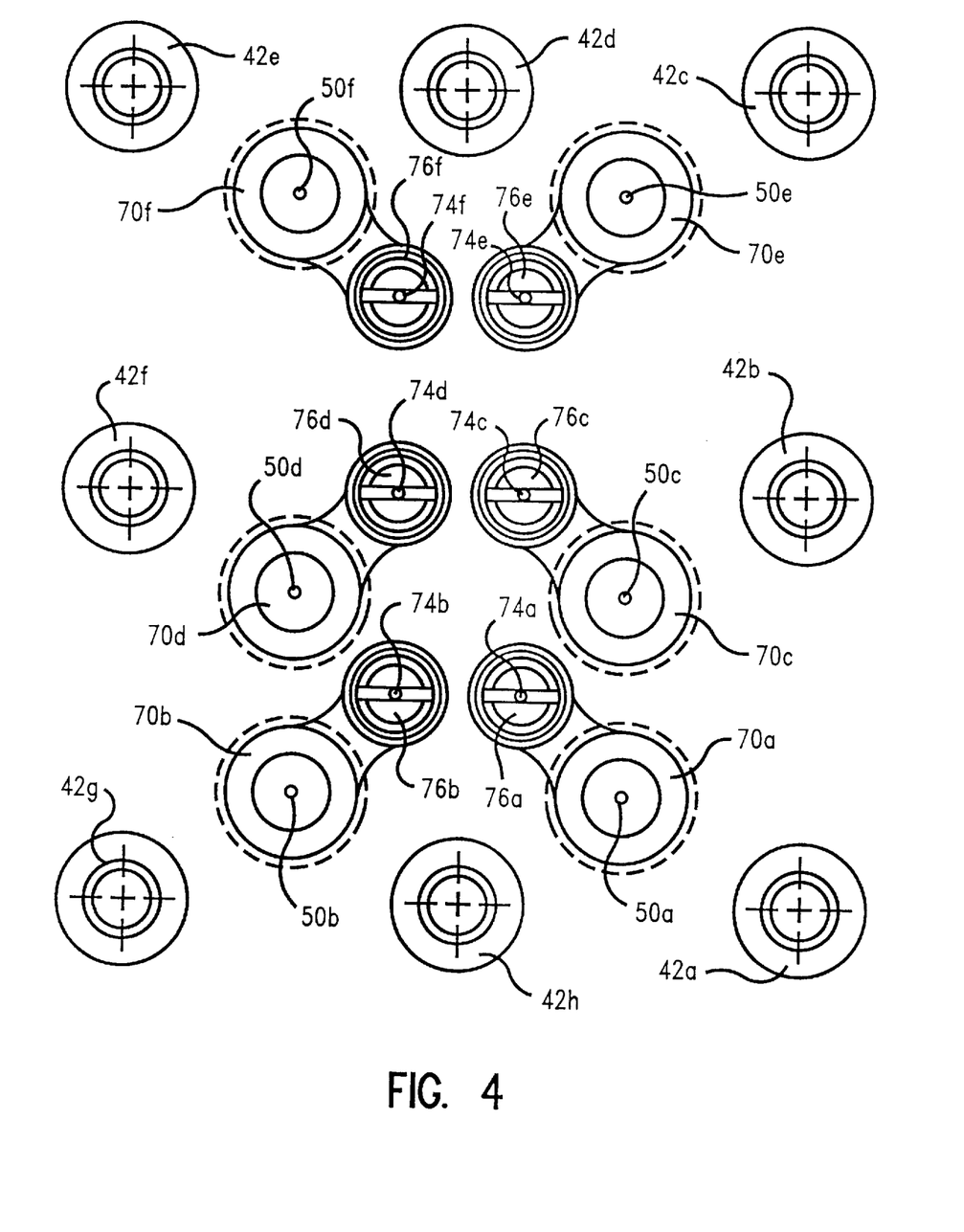
FIG. 4 is top plan view of the punch mechanisms shown in FIG. 3.

In FIGS. 3 and 4, there are shown a plurality of the punch mechanisms previously described in connection with FIGS. 1 and 2. In FIG. 3, an elevational view of a side-by-side pair of punch mechanisms mounted in the upper frame assembly 24, a first punch assembly is mounted on pushrod 50' and a second punch assembly is mounted on push 50", each pushrod passing through corresponding openings in solenoid plate 46. The corresponding features of each pushrod assembly are numbered identically to those described in connection with FIGS. 1 and 2, except that a single prime (') or double prime (") is used to distinguish the elements of the different punch assemblies.

In FIG. 4, there is shown a top plan view the punch assemblies described previously in connection with FIGS. 1 and 2, except that the assemblies are arranged so that the individual punches are aligned in horizontal grid pattern. In FIG. 4, each punch assembly is identified with the same element number as described in connection with the previous FIGS. 1–3, except that the suffix "a", "b", "c", "d", "e", and "f" are utilized to distinguish the six different punch assemblies. Preferably, the present invention is utilized in at least a 2×1 grid or a 2×2 grid, although a 2×3 grid as shown in FIG. 4, may be utilized for better results. Other grid arrangements are contemplated in accordance with the present invention.

As shown in the 2×3 grid arrangement of FIG. 4, the punches 74a, 74b, 74c, 74d, 74e, and 74f are disposed horizontally adjacent to one another. The present invention permits the spacing of the punches within a tight array such that the centerline to centerline distance of adjacent punches is less than 8 mm.

Disposed horizontally outward of the grid of the punches are the pushrod 50a, 50b, 50c, 50d, 50e, and 50f. The configuration of the actuator arms 70a, 70b, 70c, 70d, 70e and 70f as shown permits the solenoids to be of larger diameter and of greater size from centerline to centerline than the distance between the centerlines of the adjacent punches. Also shown in FIG. 4 are a number of Z drive rods 42a through 42h on which the punch assembly simultaneously are moved toward and away from the greensheet for loading and unloading. The solenoids and punches, 74a–74f are individually and selectively operable so that all or only a portion thereof may be actuated to punch a hole in the ceramic sheet.

Figure 5:
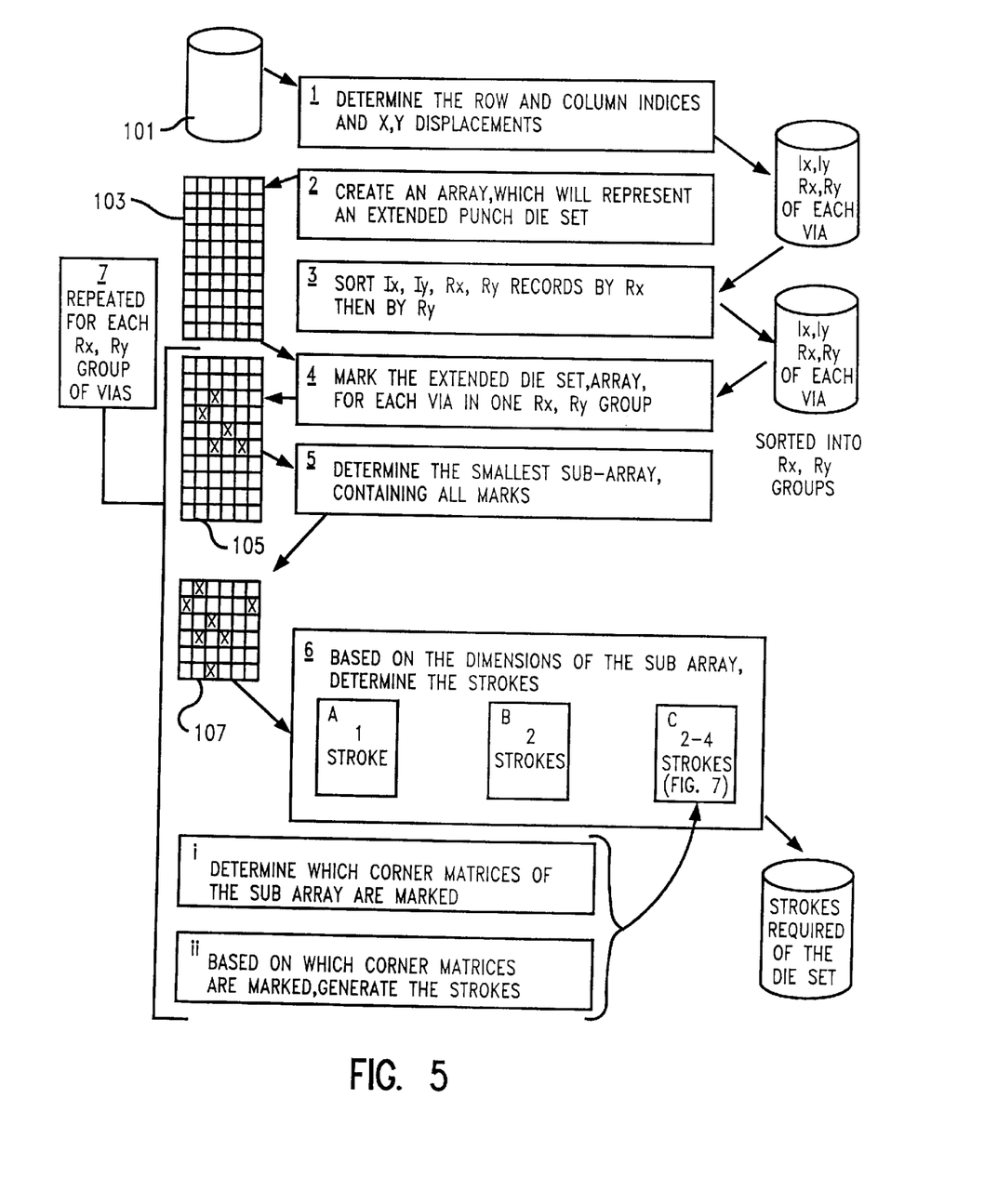
FIG. 5 is a block diagram of the steps utilized in accordance with a preferred computer program algorithm to punch holes in a substrate utilizing the multiple punch mechanism of the present invention.
Figures 6, 7:
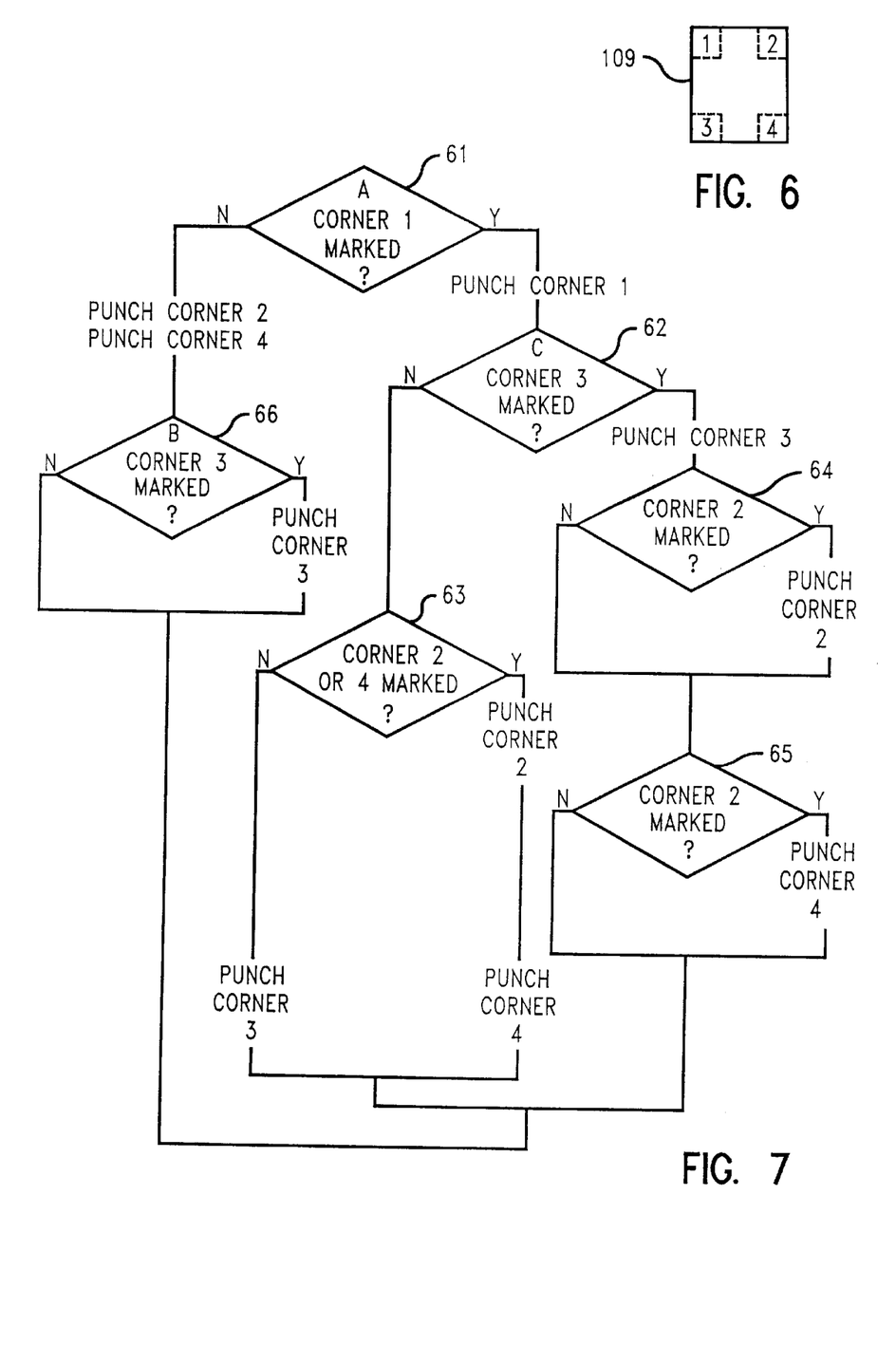
FIG. 6 is a top plan view of a matrix with each corner identified for determining if it is to be punched in accordance with the algorithm of FIG. 5.
FIG. 7 is a block diagram of the steps utilized in accordance with a preferred computer program algorithm to determine which corners of the matrix of FIG. 6 are to be punched by the multiple punch mechanism of the present invention.

The preferred control system for selectively operating the punch drives and punches is schematically shown in FIGS. 5, 6 and 7. This control system minimizes the number of simultaneous strokes of the punches needed to punch a required number of holes in the substrate.

The punch strokes required of a programmable punch die set when punching a via hole pattern in a multilayer ceramic greensheet may be appreciably reduced by use of the punch algorithm described below. The time required to calculate punch strokes by use of this algorithm is absorbed in the punch data post-processing step and does not impact actual punch operations.

Under this procedure an entire via (hole) pattern is examined at one time. Analysis then proceeds through every group of vias, which are separated horizontally by a multiple of the X pin pitch and vertically by a multiple of the Y pin pitch. A flow chart of the algorithm is shown in FIG. 5 with the definitions and notations below. Steps in the procedure are numbered to correspond with FIG. 5.

TABLE 1

Definitions and Notations

X pin pitch is the distance between any two horizontally adjacent pins

Y pin pitch is the distance between any two vertically adjacent pins

COLS is the number of columns of pins in the punch die set

ROWS is the number of rows of pins in the punch die set (xl, xh) is the horizontal range of via pattern (yl, yh) is the vertical range of the via pattern SM Rows is the number of rows in the matrix SM SM Cols is the number of columns in the matrix SM The process of controlling the punches may be described stepwise as follows:

Step 1: for each via determine via coordinates (101; FIG. 5)

Ix=(via's x coordinate−xl)/x pin pitch

Rx=remainder of [(via's x coordinate−xl/x pin pitch]

Iy=(yh−vias y coordinate)/y pin pitch

Ry=remainder of [yh−via's y coordinate)/y pin pitch]

Ix, Rx, Iy, Ry are functions of the vertical and horizontal distances, from the via to the upper left corner of the via range. Vias which do not have the same (Rx, Ry) pair cannot be punched with one stroke of the punch die set.

Step 2: Build an array M (103; FIG. 5) of dimensions, maximum, (Iy) by maximum (Ix). If the punch die set were of these dimensions, then each group of vias with the same (Rx, Ry) pair could be punched with one stroke.

Step 3: Sort the Ix, Rx, Iy, Ry records (one per via) by Rx then by Ry, to group the vias by their (Rx, Ry) pairs. For each group of vias which have the same (Rx, Ry) pair, perform Steps 4, 5 and 6.

Step 4: Mark the (Iy, Ix) entry of M for each via in this group (105; FIG. 5).

Step 5: Determine the smallest submatrix, SM of M (107; FIG. 5) which contains all marks of M and is not smaller than #ROWS by #COLS, i.e., the dimensions of the punch die set.

Step 6: Analyze SM, to determine the strokes required. This determination may fall into one of three possible cases:

Case A: The dimensions of SM are equal to #ROWS by #COLS. One stroke is required. This stroke is generated by overlaying SM with a model of the punch die set.

Case B: Exactly one of the row dimension or column dimension, of SM, is greater than #ROWS or #COLS, respectively. Two strokes are required and generated to punch this case.

Case C: Both the row and column dimensions of SM are greater than #ROWS and #COLS, respectively. In this case two to four strokes are required.

Step 6.C.i: In each corner of SM, a submatrix of dimensions (SMROWS-#ROWS) by (SMCOLS-#COLS) is examined for marked entries.

If the punch die set is positioned in any corner of the matrix SM, there are (SMROWS-#ROWS) rows and (SMCOLS-#COLS) columns left uncovered.

If any of the corner submatrices do not contain any marked entries, fewer than four strokes will be required.

Step 6.C.ii: The strokes required are generated based on which corner matrices contain marked entries, which corners are marked for matrix 109 in FIG. 6. FIG. 7 is a block diagram of the algorithm used to determine the strokes required to punch an array of vias, whose column and row dimensions are each greater than the column and row dimensions of the punch die set to be used. To punch corner 1, one overlays the matrix with a model of the punch die set so that a submatrix of size #ROWS by #COLS in the extreme upper left of the matrix is covered. The steps in FIG. 7 of determining which corner is to be punched are them followed. A similar definition applies to punching corners 2, 3, and 4.

For both Cases A and B of Step 6, the number of strokes generated is the minimum. The minimum number of strokes is also generated for Case C, except where two adjacent corner matrices contain only marks which could be reached with one stroke. In this case the procedure here disclosed would generate four strokes rather than the minimum three strokes.

Step 7: Steps 4–6 are repeated for each group Rx, Ry group of vias.

Thus, the present invention allows punches to be placed very close together with several punches within a chip attach area, and still permits each punch to be individually selectable with a solenoid or other punch drive. Normal solenoid diameter requirements would limit punch spacing to a minimum of about 8 to 10 mm spacing if the punches were placed directly under and aligned with the solenoids as in the prior art. Such spacing requirement would typically restrict the punch count to 1 punch per chip area. The present invention optimizes throughput by allowing 4, 6 or more punches to be active thus potentially providing a 4 to 6 or more times throughput enhancement by permitting several closely spaced punches to be extended at every punch stroke. Full programming capability is permitted allow, allowing die changes to be made to closely spaced configurations such as C-4 flip-chip technology without requiring new die designs and hardware.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for simultaneously punching multiple holes in a ceramic substrate comprising:
   a frame;
   a plurality of vertically movable and individually operable punch drives, each having an associated punch, said punch drives disposed on said frame selectively movable up and down relative to said frame; and
   a member extending from each of said punch drives and movable vertically by operation of the punch drives,
   said associated punch extending from each of the extending members and movable vertically by said extending members, each of the punches being horizontally offset from and non-coaxially aligned with the associated vertical punch drive, each of said punches being operable individually and operable simultaneously with selected others of said punches to punch one or more holes in a substrate at the same time.

2. The apparatus of claim 1 wherein each of said punch drives comprises a mechanically operated solenoid.

3. The apparatus of claim 1 wherein said punches are disposed horizontally adjacent to one another.

4. The apparatus of claim 3 wherein said vertical punch drives are disposed horizontally outward of said punches.

5. The apparatus of claim 1 comprising at least two of said punches and wherein said punches are disposed horizontally adjacent to one another in at least a 2×1 grid.

6. The apparatus of claim 5 wherein the vertical punch drives associated with said punches are disposed horizontally outward of the grid of said punches.

7. The apparatus of claim 1 wherein said punches are disposed horizontally adjacent to one another with a spacing between adjacent punches of approximately 1 mm to 8 mm.

8. The apparatus of claim 1 wherein said member extending from each of said punch drives comprises an arm extending horizontally from said punch drives, said arm having at an end away from the punch drive a cavity for receiving said punch.

9. The apparatus of claim 1 further including a control system for selectively operating said punch drives, said control system adaptable to minimize the number of simultaneous strokes of said punches needed to punch a required number of holes in a substrate.

10. An apparatus for simultaneously punching multiple holes in a ceramic substrate comprising:
    a frame;
    a plurality of vertically movable pushrods disposed on said frame;
    an individually operable punch drive associated with each of said vertical pushrods for selectively moving said pushrods up and down, each pushrod having an associated punch; and
    an arm extending horizontally from each of said pushrods and movable vertically by operation of the punch drives,
    said punch extending from said arm and movable vertically by said arm, said punch being horizontally offset from the associated vertical pushrod, said punch being operable individually and operable simultaneously with selected others of the punches to punch one or more holes in a substrate at the same time.

11. The apparatus of claim 10 comprising at least two of said punches and wherein said punches are disposed horizontally adjacent to one another in at least a 2×1 grid.

12. The apparatus of claim 11 wherein the vertical pushrods associated with said punches are disposed horizontally outward of the grid of said punches.

13. The apparatus of claim 10 wherein said punches are disposed horizontally adjacent to one another with a spacing between adjacent punches of approximately 1 mm to 8 mm.

14. The apparatus of claim 10 further including a control system for selectively operating said punch drives, said control system adaptable to minimize the number of simultaneous strokes of said punches needed to punch a required number of holes in a substrate.

15. An apparatus for punching holes in a ceramic substrate comprising:
    a frame;
    a substrate holder mounted on said frame capable of horizontal movement to position said ceramic substrate in a desired location;

said ceramic substrate disposed on said substrate holder, said ceramic substrate having a location where a hole is desired to be punched;

a vertically movable pushrod disposed on said frame and horizontally offset from the desired substrate hole location;

a magnetically operable solenoid drive associated with a vertical drive guide for selectively moving said pushrod up and down in individual strokes;

an arm extending horizontally from said pushrod and movable vertically by operation of the drive; and a punch extending from said arm and movable vertically by said arm a stroke distance equal to the stroke distance of said pushrod, the punch being horizontally offset from said vertical pushrod and vertically aligned with said desired substrate hole location, said punch being operable to punch a hole in a substrate at said desired substrate hole location.

16. A method of simultaneously punching multiple holes in a ceramic substrate comprising the steps of:

a) providing a punch apparatus comprising a frame; a plurality of vertically movable and individually operable punch drives disposed on said frame, each of said punch drives having an associated punch, said punch drives selectively movable up and down relative to said frame; a member extending from each of said punch drives and movable vertically by operation of the punch drives; and said punch extending from each of said extending members and movable vertically by said extending members, each of the punches being horizontally offset from the associated vertical punch drive;

b) positioning a substrate beneath said punches; and c) individually and simultaneously operating a selected number of said punches to punch one or more holes in a substrate at the same time, each hole being punched at a position non-coaxially aligned with the vertical punch drive associated with the punch making said hole.

17. The method of claim 16 wherein said holes are disposed horizontally adjacent to one another in at a grid pattern.

18. The method of claim 16 wherein the vertical punch drives associated with said punches are disposed horizontally outward of the grid of said punches, and wherein said holes are disposed horizontally inward of said punch drives.

19. The method of claim 16 wherein said holes are disposed horizontally adjacent to one another with a spacing between adjacent holes of approximately 1 mm to 8 mm.

20. The method of claim 16 further including the step of controlling the operation of said punch drives to minimize the number of simultaneous strokes of said punches needed to punch a required number of holes in a substrate.

21. An apparatus for simultaneously punching multiple holes in a ceramic substrate comprising:

a frame;

a plurality of vertically movable and individually operable punch drives, each of said punch drives having an associated punch, said punch drives disposed on said frame selectively movable up and down relative to said frame; and, a member extending from each of said punch drives and movable vertically by operation of the punch drives;

said associated punch extending from each of the extending members and movable vertically by said extending members, each of the punches being horizontally offset from and non-coaxially aligned with the associated vertical punch drive, each of said punches being operable individually and operable simultaneously with selected others of said punches to punch one or more holes in a substrate at the same time; and, a control system for selectively operating said punch drives, said control system adaptable to minimize the number of simultaneous strokes of said punches needed to punch a required number of holes in a substrate.

22. An apparatus for simultaneously punching multiple holes in a ceramic substrate comprising:

a frame;

a plurality of vertically movable pushrods disposed on said frame;

an individually operable punch drive associated with each of said vertical pushrods for selectively moving said pushrods up and down, each pushrod having an associated punch; and, an arm extending horizontally from each of said pushrods and movable vertically by operation of the punch drives, said punch extending from said arm and movable vertically by said arms, said punch being horizontally offset from the associated vertical pushrod, said punch being operable individually and operable simultaneously with selected others of the punches to punch one or more holes in a substrate at the same time; and, a control system for selectively operating said punch drives, said control system adaptable to minimize the number of simultaneous strokes of said punches needed to punch a required number of holes in a substrate.

23. A method of simultaneously punching multiple holes in a ceramic substrate comprising the steps of:

a) providing a punch apparatus comprising a frame; a plurality of vertically movable and individually operable punch drives disposed on said frame, each punch drive having an associated punch, said punch drives selectively movable up and down relative to said frame; a member extending from each of said punch drives and movable vertically by operation of the punch drives; and said punch extending from each of said extending members and movable vertically by said extending members, each of the punches being horizontally offset from the associated vertical punch drive;

b) positioning a substrate beneath said punches;

c) individually and simultaneously operating a selected number of said punches to punch one or more holes in a substrate at the same time, each hole being punched at a position non-coaxially aligned with the vertical punch drive associated with the punch making said hole; and, d) controlling the operation of said punch drives to minimize the number of simultaneous strokes of said punches needed to punch a required number of holes in a substrate.

* * * * *

UNITED STATES PATENT AND TRADEMARK OFFICE
CERTIFICATE OF CORRECTION

PATENT NO. : 6,006,636
DATED : December 28, 1999
INVENTOR(S) : Baldwin et al.

Page 1 of 2

It is certified that error appears in the above-identified patent and that said Letters Patent is hereby corrected as shown below:

Col. 1, line 65, after "present" delete "object" and substitute therefore -- -- invention -- --

Col. 2, line 43, after "position", delete -- --a-- --

Col. 3, line 11, after "in" delete -- -- at-- --

Col. 7, line 16, delete "them" and substitute therefore -- --then-- --

Col. 7, line 40, after "permitted" delete -- -- allow-- --

Col. 9, line 41, after "in" delete -- --at-- --

In the drawings:

Delete "Figure 4" and substitute therefore Formal Drawing - -Figure 4- -- as shown on the attached sheet.

Signed and Sealed this

Fifth Day of September, 2000

Attest:

Q. TODD DICKINSON

*Attesting Officer*   *Director of Patents and Trademarks*

FIG. 4